United States Patent [19]

Ohta

[11] Patent Number: 4,500,924
[45] Date of Patent: Feb. 19, 1985

[54] SOLID STATE IMAGING APPARATUS

[75] Inventor: Yoshio Ohta, Amagasaki, Japan

[73] Assignee: Matsushita Electric Industrial Co., Ltd., Osaka, Japan

[21] Appl. No.: 408,776

[22] Filed: Aug. 17, 1982

Related U.S. Application Data

[63] Continuation of Ser. No. 205,596, Nov. 10, 1980, abandoned.

[30] Foreign Application Priority Data

Nov. 16, 1979 [JP] Japan .................................. 54-149375
Nov. 16, 1979 [JP] Japan .................................. 54-149376
Nov. 16, 1979 [JP] Japan .................................. 54-149378

[51] Int. Cl.[3] ...................... H04N 3/14; H01L 27/14; H01L 29/161; H01L 29/78
[52] U.S. Cl. .................................... 358/213; 357/16; 357/30; 357/31; 357/24
[58] Field of Search .................. 358/213, 212; 357/16, 357/30, 31, 24; 250/211 R, 211 J, 578

[56] References Cited

U.S. PATENT DOCUMENTS 4,236,829 12/1980 Chikamura et al. .................. 357/16

Primary Examiner—Thomas W. Brown
Assistant Examiner—Robert Lev
Attorney, Agent, or Firm—Wenderoth, Lind & Ponack

[57] ABSTRACT

A solid state imaging apparatus which includes a plurality of cells formed on a semiconductor substrate and produces a video signal representing an optical image of an object. Each cell comprises a photosensitive first diode, a second diode connected to the first diode and a switching element connected to the connection point of the first and second diodes, for reading out charge signals from the first diode under the control of a read pulse. To one of the first and second diodes the blooming suppression pulse is supplied in synchronism with the read pulse so as to enlarge a dynamic range of the imaging apparatus.

19 Claims, 12 Drawing Figures

FIG.3c

SOLID STATE IMAGING APPARATUS

This application is a continuation of now abandoned application Ser. No. 205,596, filed Nov. 10, 1980.

BACKGROUND OF THE INVENTION

This invention relates to a solid state imaging apparatus utilizing a photodiode array, a MOS transistor array, a charge transfer device such as a CCD (Charge Coupled Device) and a BBD (Bucket Brigade Device) or a combination thereof, and more particularly to such apparatus which stores charges in proportion to the intensity of incident light and produces a sequential video signal.

As is well known, it is preferable to use a solid state area imaging device for a television camera in place of a pick up tube for converting an optical image of an object to an electrical video signal, in the case where a compact size, long life, high stability and a lower power consumption are required. However, there remain problems in utilizing such device as a practical imaging apparatus.

One of the typical problems is the blooming phenomenon. Blooming is especially objectionable in an imaging devices with high sensitivity, since even a usual light source causes overload at high light portions in a low-light-level environment. Blooming is caused by excess charges generated in a photosensor such as a photodiode. To make such a solid state imaging apparatus capable of operating without blooming in the presence of excessive high light portions, several methods of suppressing blooming have been proposed.

One of the practical methods employs an OFD (Over Flow Drain) within the image sensor to absorb excess charges, is shown in Bell Syst. Tech. Journal, Vol. 51, PP. 1923-1926, 1972. But this method has several problems which are as follows:

The first problem is the limitation of the blooming suppression due to the limitation of the OFD's space in the imaging area. The reason thereof is that quantity of excess charge absorption is mainly proportional to the area of the OFD. The second problem is the decrement of the sensitivity of the imaging apparatus, because of the decrement of the effective area of photosensor due to the existence of the OFD.

Another practical method for suppressing the blooming phenomenon is providing such an n-p-n structure in the imaging area so as to absorb excess charges into the n type substrate of the n-p-n structure, such as shown in ISSCC (International Solid-State Circuits Conference) Dig. of Tech. Papers, pp. 192-193, Feb. 1972. This technique also has problems in that the effect of the blooming suppression is not so high because of the spreading of generated excess charges through the n type substrate of the n-p-n structure into adjacent regions.

SUMMARY OF THE INVENTION

An object of the present invention, therefore, is to provide a solid state imaging apparatus in which the blooming is satisfactorily suppressed without decreasing the sensitivity.

Another object of the present invention is to provide a solid state imaging apparatus, in which it is possible to read video signal from its imaging area with a low power consumption and with a large dynamic range.

According to the present invention, there is provided an electrode which is capacitively coupled to a node at which a photosensitive element and a switching element are connected in series, and where a bias voltage including a blooming suppression pulse is supplied to the electrode. The blooming suppression pulse is in synchronism with a read pulse which is supplied to the switching element to read accumulated charge signals from the photosensitive element and functions so as to expand the voltage supplied to the photosensitive element.

According to an embodiment of the present invention, there is provided a plurality of pairs of combinations comprising a first diode and a switching transistor formed into a matrix, a plurality of second diodes respectively coupled to the first diodes, one of the first and second diodes being a photodiode, wherein a bias voltage including a blooming suppression pulse is supplied to each of the first and second diodes. Each connection point of the first and second diodes is clamped at the bias voltage when an accumulated charge signal is about to exceed a predetermined amount due to a large intensity light.

BRIEF DESCRIPTION OF THE DRAWINGS

FIGS. 3a, 3b, 3c and 3d are diagrams showing waveforms for describing the operation of the embodiment of FIG. 1.

DETAILED DESCRIPTION OF THE PREFERRED EMBODIMENTS

Figure 1:
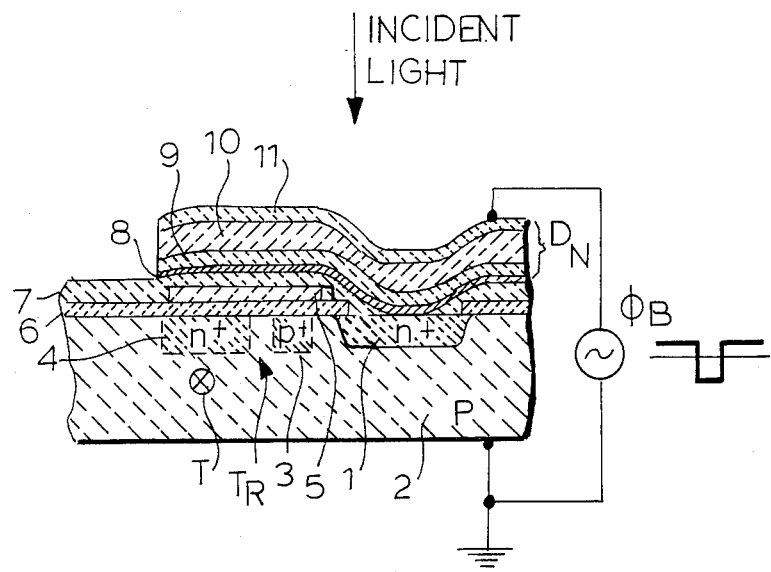
FIG. 1 is a sectional view of a solid state imaging apparatus according to the present invention.
Figure 2:
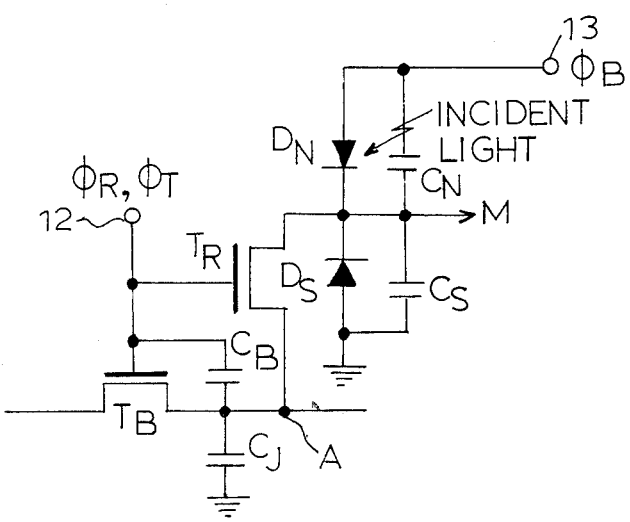
FIG. 2 is a schematic diagram illustrating an equivalent circuit of the apparatus shown in FIG. 1.

FIG. 1 and FIG. 2 show one cell of the imaging area of one embodiment of a solid state imaging apparatus according to this invention. The cell includes a p-n heterojunction photoconductor $D_N$, a diode $D_S$, a read-gate FET $T_R$ and a BBD gate FET $T_B$. The diode $D_S$ is constructed by forming a n+ type diffused region 1 in a P type substrate 2, which diffused region 1 also constitutes a drain region of the read-gate FET $T_R$. A P+ region 3 operates as a potential barrier for preventing an injection of electrons from the n+ region 1 to a n+ region 4 which constitutes a source region of the read-gate FET $T_R$. The p+ region 3 is provided only in the case where vertical scanning shift registers for transfering signal charges from imaging cells to an output horizontal register consist of CCDs. In case the vertical scanning shift registers are constituted by BBDs, the n+ type region 4 is constructed in the substrate as shown in the said figure. Since the transfer function of CCDs and the BBDs is substantially same, the operation of the embodiment of this invention is described as follows in the case of utilizing BBDs.

A first gate electrode 5 has a overlapping area with the n+ type region 4. A gate oxide layer 6 insulates the first gate electrode 5 from the substrate 2. A insulator 7 is formed on the first gate electrode 5 and insulates a first matal electrode 8 from the first gate electrode 5 and the substrate 2. The electrode 8 is in contact with n+ type region 1, and is utilized as the cathode electrodes of both diode $D_S$ and the p-n heterojunction photoconductor $D_N$ constructed therewith, for example, ZnSe 9 and $Zn_{1-x}Cd_xTe$ 10. A transparent electrode 11 is deposited on the photoconductor $D_N$. A symbol T represents the direction of the signal charge transfer through the vertical scanning shift register.

Figure 3A:
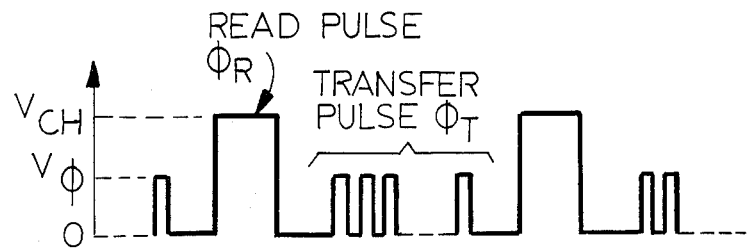
Figure 3B:
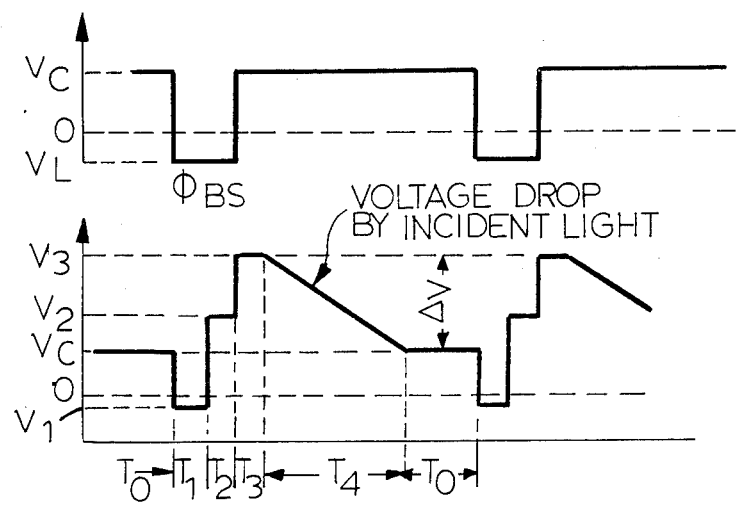

FIG. 2 is an equivalent circuit of the cell shown in FIG. 1. A numeral 12 represents a terminal for supplying a read pulse $\emptyset_R$ and transfer pulse $\emptyset_T$ such as shown in FIG. 3a to the first gate electrode 5 of the transistors $T_R$ and $T_B$. A symbol $C_B$ represents a capacitance of a bucket for counstructing BBD and Cj represents a junction capacitance. The cathode electrode of the photoconductor $D_N$ and the diode $D_S$ are connected to each other at a node M. Symbols $C_N$ and $C_S$ represent the equivalent capacitance of the photoconductor $D_N$ and the diode $D_S$, respectively. A numeral 13 is an input terminal which corresponds to the transparent electrode 11 in FIG. 1, and to which a bias voltage $\emptyset_B$ such as shown in FIG. 3b is supplied.

In this embodiment, the bias voltage $\emptyset_B$ includes a blooming suppression pulse $\emptyset_{BS}$ which is in synchronism with the read pulse $\emptyset_R$ supplied to the input terminal 12. The operation of the above mentioned embodiment is described hereinafter.

FIG. 3a is a diagram showing the waveform of a clock pulse $\emptyset$ composed of the read pulse $\emptyset_R$ for reading signal charges from picture elements, i.e. photoconductors $D_N$, and the transfer pulse $\emptyset_T$ for transfering the signal charges. The voltages of the read pulse $\emptyset_R$ and the transfer pulse $\emptyset_T$ are $V_{CH}$ and $V_\emptyset$, respectively. FIG. 3b is a diagram showing the waveform of the bias voltage $\emptyset_B$ which includes the blooming suppression pulse $\emptyset_{BS}$. The bias level of the bias voltage $\emptyset_B$ is $V_C$ with a positive polarity and the voltage of the blooming suppression pulse $\emptyset_{BS}$ is $V_L$ with a negative polarity.

With the application of the clock pulse $\emptyset$ and the bias voltage $\emptyset_B$ to the terminals 12 and 13, respectively, the potential of the node M in FIG. 2 changes such as shown by wave form of FIG. 3c. The operation of the apparatus of this embodiment is described in detail at respective periods $T_1$-$T_4$ of FIG. 3c as follows.

(i) Period $T_1$

When the voltage of the terminal 13 changes from $V_C$ to $V_L$ in response to the blooming suppression pulse $\emptyset_{BS}$ at the beginning of the period $T_1$, the potential of the node M changes to $V_1$ such as determined by the formula:

$$V \cdot C_S = (V_1 - V_L) \cdot C_N + V_1 \cdot C_S$$

where V represents the voltage of the node M at the end of the preceeding period $T_0$. Therefore, $v_1$ is expressed by:

$$v_1 = \frac{V \cdot C_S + V_L \cdot C_N}{C_N + C_S} \quad (1)$$

Assuming that the node M has been clamped at the voltage level $V_C$ due to large intensity light in the preceeding period $T_0$, such as shown in FIG. 3c, V is equal to $V_C$. Then $v_1$ becomes $V_1$ and is expressed by:

$$V_1 = \frac{V_C \cdot C_S + V_L \cdot C_N}{C_N + C_S} \quad (2)$$

(ii) Period $T_2$

At the beginning of the period $T_2$, the read pulse $\emptyset_R$ is supplied to the terminal 12. The voltage $V_{CH}$ of the read pulse $\emptyset_R$ is divided by capacitances $C_B$ and Cj, and the divided voltage is applied to the node A of the transfer stage $T_B$. At this instant, the potential of the node A changes from $V_R$ to $V_h$, and is expressed as follows:

$$V_h = V_R + \frac{C_B}{C_B + C_j} \cdot V_{CH} \quad (3)$$

where $V_R$ is the preceeding potential of the node A, which is set up by the transfer pulse $\emptyset_T$ and expressed as $V_R = V_\emptyset - V_{TB}$, $V_{TB}$: the threshold voltage of the FET $T_B$. With the read pulse $\emptyset_R$, the gate FET $T_R$ is on, and charges which are in proportion to the intensity of the light are transfered into the node M from the node A; in other words, signal charges are read cut through the FET $T_R$ into the capacitor $C_B$. As a result, the potential of node M rises to the cut-off voltage of the FET $T_R$. The cutoff voltage $V_2$ is expressed as:

$$V_2 = V_h - V_{TC} - K_{SB} \quad (4)$$

where $V_{TC}$ is the threshold voltage of the read gate FET $T_R$, and $K_{SB}$ is an increased component of the threshold voltage due to a substrate bias effect.

From the expressions (3) and (4), $V_2$ is given as follows:

$$V_2 = (V_\phi - V_{TB}) + \frac{C_B}{C_B + C_j} \cdot V_{CH} - V_{TC} - K_{SB} \quad (5)$$

This voltage $V_2$ is, therefore, constant.

In this state, charges $Q_M$ stored in the capacitors $C_N$ and $C_S$ is expressed by:

$$Q_M = (V_2 - V_L) \cdot C_N + V_2 \cdot C_S \quad (6)$$

(iii) Period $T_3$

At the beginning of the period $T_3$, the potential of the terminal 13 changes from $V_L$ to $V_C$, and so the potential of the node M rises from $V_2$ to $V_3$ because of the capacitive coupling by the junction capacitance $C_N$. The voltage $V_3$ is defined by the following equation:

$$Q_M = (V_3 - V_C) \cdot C_N + V_3 \cdot V_S \quad (7)$$

Therefore, from the equations (6) and (7), the potential $V_3$ is given by:

$$V_3 = V_2 + \frac{C_N}{C_N + C_S} \cdot (V_C - V_L) \quad (8)$$

If, in a practical embodiment, the capacitances and the voltages are selected, for example, to have the following values:

$C_B = 0.1$ pF, $C_j = 0.03$ pF, $C_N = 0.06$ pF, $C_S = 0.03$ pF, $V_C = 7$ V, $V_L = -5$ V,

-continued $V_b = 8$ V, $V_{TB} = 1$ V, $V_{CH} = 14$ V, $V_{TC} = 3$ V, $V_{SB} = 6$ V, $V_1$, $V_2$ and $V_3$ are given as follows:

$V_1 = -1.0$ V $V_2 = 8.7$ V $V_3 = 16.7$ V (iv) Period $T_4$

In this period, the signal charges read out into the capacitor $C_B$ during the read pulse period and temporarily stored therein are transfered out through the vertical scanning shift register in the direction T in FIG. 1 under the control of the transfer clock pulse $\phi_t$. On the other hand, the potential of the node M deminishes in proportion to the intensity of the incident light upon the photoconductor $D_N$. Even if the intensity of the incident light is excessively large, such as in this case, the potential of the node M does not decrease to below $V_C$, because the node M is clamped at the bias level $V_C$ by the heterojunction photoconductor $D_N$, when the potential thereof is about to exceed the potential $V_C$. As a result the excess charge is removed through the electrode 11 and the terminal 13, so that the excess signal charges are not diffused into the substrate, and therefore the blooming phenomenon is significantly suppressed.

The voltage $V_C$ is selected to be at a certain level which is higher than the voltage of the transfer pulse $\phi_T$ so that the signal charges are not read out by the transfer pulse $\phi_T$ through the read gate FET $T_R$. If the voltage $V_C$ is high, the effect of blooming supression becomes large but the dynamic range of the imaging apparatus becomes small. Therefore, the amplitude of the voltage $V_C$ should be selected preferably in consideration of such a tradeoff.

The dynamic range of the imaging apparatus is decided by the voltage difference $\Delta V$, i.e. the saturation signal voltage, such as given by:

$$\Delta V = V_3 - V_C \tag{9}$$

The signal charges representing the total amount of the incident light during one charge accumulation period, that is, almost one field or frame period of the conventional solid state imaging apparatus, are read out by the read pulse $\phi_R$ through the read gate FET $T_R$ into the vertical transfer channel.

According to this embodiment, in the period $T_3$, the voltage $[C_N/(C_N+C_S)] \cdot (V_C - V_L)$ is added to the potential $V_2$ of the node M. Therefore, the dynamic range is enlarged with such an added increment in the potential of the node M. Thus, the range operable without blooming is enlarged. In the case when the values of the capacitances and the voltages are given such as mentioned above the saturation signal voltage $\Delta V$ is given from the formula (9) as $$\Delta V = V_3 - V_C \tag{10}$$

$= 16.7 - 7.0$ V $= 9.7$ V

Figure 3D:
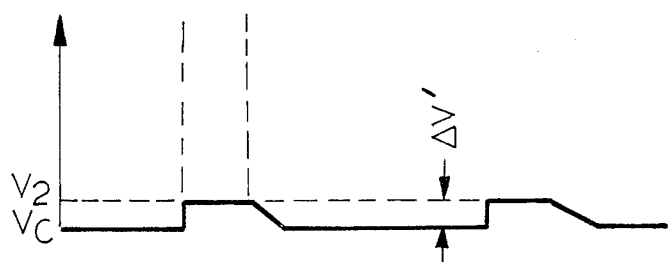

On the other hand, when the blooming suppression pulse $\phi_{BS}$ is not supplied to the electrode 11 as illustrated in FIG. 3d, the saturation signal voltage $\Delta V'$ is given as $$V' = V_2 - V_C \tag{11}$$

$= 2.7$ V

Figure 4:
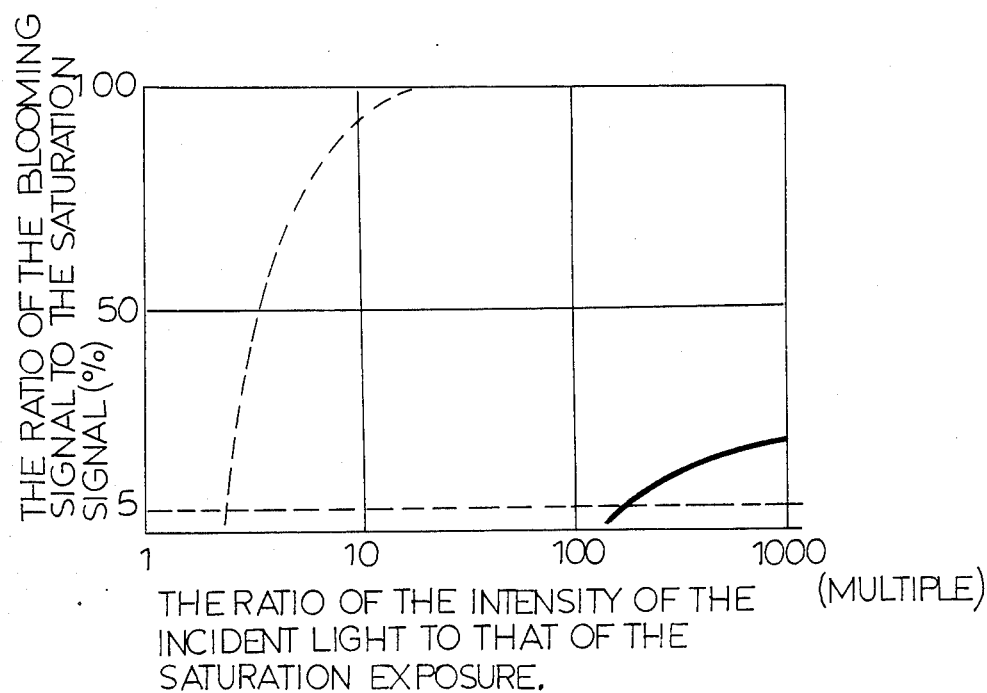
FIG. 4 is a graph illustrating an effect of suppressing blooming according to the embodiment of FIG. 1.

It is obvious from the expressions (10) and (11), that according to this embodiment the dynamic range is, enlarged by $V_3 - V_2$, that is 7 volts, with respect to the latter apparatus. The experimental data representing blooming suppression characteristics of the embodiment described above are shown in FIG. 4. In the same figure, the abscissa axis represents the intensity of the incident light which is expressed as a multiple of a saturation exposure, and the ordinate axis represents the ratio of the blooming signal to the saturation signal in percent. In this case, the amount of the blooming signal is defined as the amount of quasi-output signal which is generated in the direction of the vertical transfer in the imaging apparatus when the signal charges are read out from the black background surrounding a white spot which is located at the center of the imaging area. The amount of the saturation signal is defined as the amount of the output signal read out from the white spot. In the same figure, the dotted curve represents a characteristic of the conventional case where the blooming suppression pulse is not supplied, and the solid curved line represents a characteristic of the embodiment of this invention. As is evident from the FIG. 4, if the limit of the allowable blooming signal rates is 5%, the apparatus of this embodiment has the effect of blooming suppression against light having an intensity more than a hundred times as large as that of the saturation exposure. On the other hand, the conventional apparatus has the effect against light having an intensity which is less than twice as large as that of the saturation exposure.

Figure 5A:
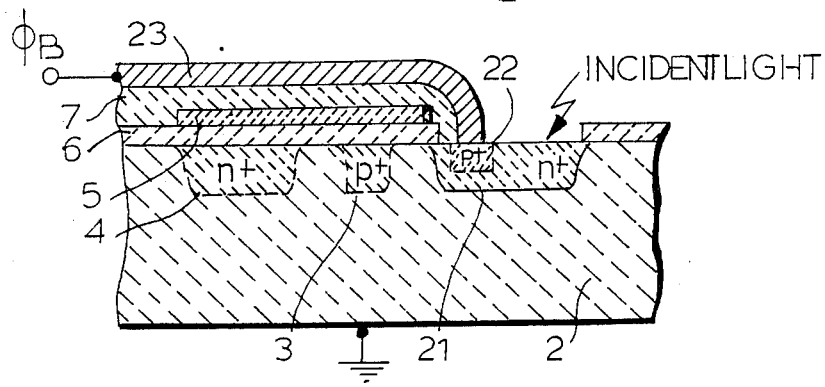
FIGS. 5a and 5b are respectively a sectional view showing an another embodiment of the invention and an equivalent circuit diagram thereof.
Figure 5B:
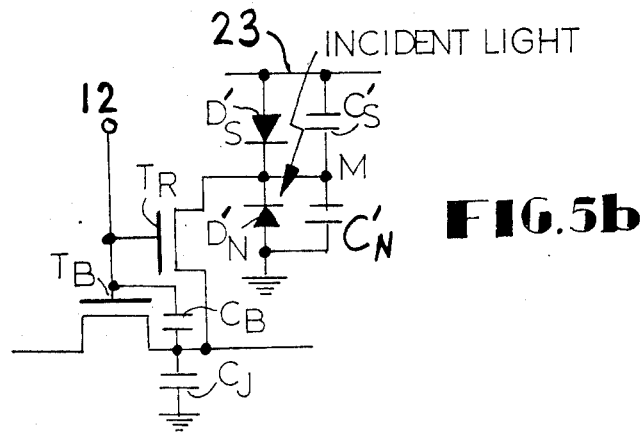

FIGS. 5a and 5b show a cell structure of an another embodiment of the invention and the equivalent circuit thereof, respectively. The difference of this embodiment with respect to the previous embodiment of FIGS. 1 and 2 exists in a construction of a photosensitive element $D_N'$ and a diode $D_S'$. In this embodiment, the diode $D_S'$ and the photodiode $D_N'$ are utilized in place of the heterojunction photoconductor $D_N$ and the diode $D_S$ shown in FIG. 2, respectively. In FIG. 5a, 21 is an n+ diffused region formed in the substrate 2 of p type semiconductor. The photodiode $D_N$ is constructed by the n+ region 21 and the substrate 2. A p+ diffused region 22 is provided in the n+ region 21, so as to construct the diode $D_S'$ in combination with the n+ diffused region 21. The p+ region 22 is connected electrically to an electrode 23. In the equivalent circuit of FIG. 5b, $C_S'$ is the junction capacitance of the diode $D_S'$ and $C_N$ is that of the diode $D_N'$. In FIGS. 5a and 5b, the constructions of the portions represented by the same symbols as those in FIGS. 1 and 2 are the same as those in FIGS. 1 and 2. In the solid state imaging apparatus of this embodiment, the bias voltage $\phi_B$, including blooming suppression pulse $\phi_{BS}$ shown in FIG. 3b, is supplied to the terminal of the electrode 23. With respect to blooming suppression, the function of this embodiment is similar to that of the preceeding embodiment of FIGS. 1 and 2. It is well understood from FIGS. 3a, 3b, 3c and 3d, and the description thereof. Although the heterojunction photoconductor $D_N$ or the diode $D_S'$ is utilized as the element through which the bias voltage is supplied in the above mentioned embodiments, it is not essential for the invention. It is also possiblle to utilize a capacitor in place of such element.

Figure 6A:
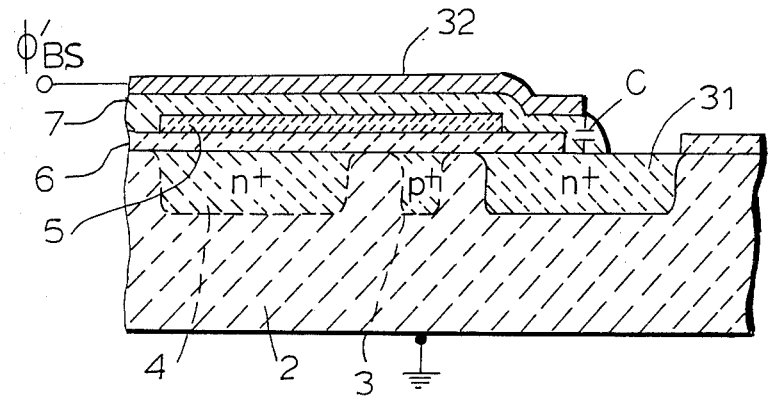
FIGS. 6a and 6b are respectively a sectional view showing a further embodiment of the invention and an equivalent circuit diagram thereof.
Figure 6B:
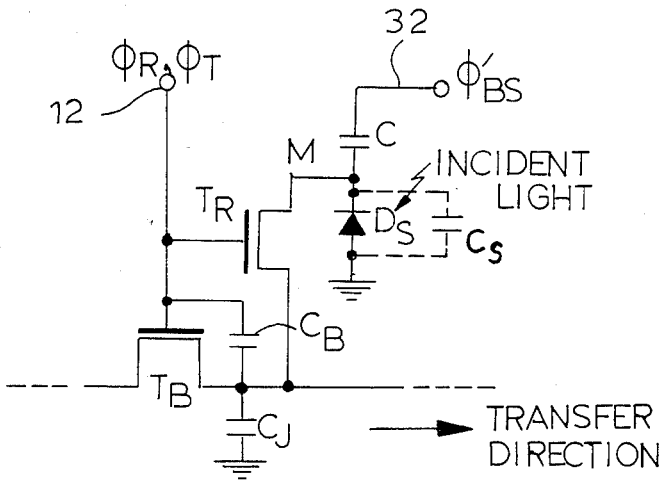

FIGS. 6a and 6b illustrate a further embodiment employing such construction. FIG. 6a shows a cell structure of this embodiment, and FIG. 6b the equivalent circuit therof. In these figures, the elements with the same symbols as in FIGS. 1a and 1b have the same construction as those in FIGS. 1a and 1b. A numeral 31 in FIG. 6a is an n+ diffused region such as the region 1 in FIG. 1. An electrode 32 is formed on the insulating layer 7 so that it has an overlapping portion in part with the n+ diffused region 31. The n+ region 31, the oxide layer 6, the insulating layer 7, and the electrode 32 constitute a capacitor C. A waveform of a blooming suppression pulse which is supplied to the electrode 32 is almost the same as that of the bias voltage $\phi_{BS}$ except that it does not include a DC level. Therefore, the operation of this embodiment is almost the same as those of the preceeding embodiments except that the node M is not clamped at a certain voltage level in the accumulation period T4. Only the dynamic range of the imaging apparatus is enlarged in this case. That is to say, the potential of the node M rised by $[C/(C+C_S)] \cdot (V_C - V_L)$ in this apparatus when the blooming suppression pulse is supplied to the electrode 32. The increment of the node potential corresponds to that in the embodiment of FIGS. 1 and 2, that is $[C_N/(C_N+C_S)] \cdot (V_C - V_L)$. Therefore, the allowable range of the incident light in which the apparatus is operable without blooming is enlarged.

Figure 7:
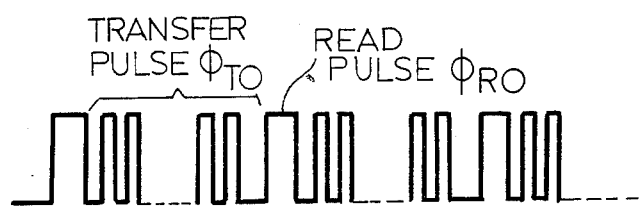
FIG. 7 is a diagram showing a waveform for describing the operation of a further embodiment of the invention.

FIG. 7 represents a clock pulse $\phi_0$ of a further embodiment in which lower power consumption is obtained. The construction thereof may be the same as that of FIG. 1 and a bias voltage is also the same as FIG. 3b. The salient feature of this embodiment is the shape of the clock pulse $\phi_0$ in which the amplitude of the read pulse $\phi_{R0}$ is smaller than that of the embodiment of FIG. 1 so as to be almost equal to the amplitude of the transfer pulse $\phi_{T0}$. This feature makes it possible to realize the imaging apparatus with a lower power consumption. In spite of the fact that the read pulse $\phi_{R0}$ has such a small amplitude, a sufficient dynamic range of the apparatus is preferably obtained by selecting the amplitude of the blooming suppression pulse $\phi_{BS}$.

Although this invention is described in reference to the apparatus employing the inter-line transfer method the use of such a method is not essential for the invention. It is possible to apply this invention to apparatus employing other methods such as the frame transfer method, and also to a linear imaging apparatus.

It is obvious that this invention is also applicable to the imaging apparatus which operates in an interlace mode, though the above-disclosure refers only to noninterlace imaging apparatus for the simplicity.

What is claimed is:

1. A solid state imaging apparatus having a substrate and a plurality of cells formed on the substrate, which accumulate charge signals in response to an intensity of an incident light from an object and producing a video signal representing an optical image of the object, by reading the charge signals from said cells, in which each of said cells comprises:
   a photosensitive element;
   a switching element which is substantially connected to said photosensitive element;
   and an electrode which is capacitively coupled to a connection point located between said photosensitive element and said switching element;
   said apparatus further comprises a first means for applying a read pulse to said switching element of each of said cells to control said switching element such that the charge signals are read out therefrom; and said apparatus further comprises a second means for supplying a blooming suppression pulse to said electrode of each of said cells in synchronism with said read pulse.

2. A solid state imaging apparatus as claimed in claim 1, wherein said photosensitive element comprises a heterojunction photoconductor which also serves to capacitively couple said connection point to said electrode.

3. A solid state imaging apparatus as claimed in claim 1, wherein a capacitor is used for capacitively coupling said connection point to said electrode.

4. A solid state imaging apparatus as claimed in claims 1, 2 or 3, wherein said switching element comprises a FET.

5. A solid state imaging apparatus having a substrate and plurality of cells formed on the substrate, which accumulate charge signals in response to an intensity of an incident light from an object and producing a video signal representing an optical image of the object by reading the charge signals from said cells, in which each of said cells comprises:
   a first diode which has a junction capacitance and accumulates the charge signals therein;
   a switching element which is substantially connected to said first diode and reads out the charge signals therefrom under the control of a read pulse applied to a control electrode thereof;
   a second diode which has a junction capacitance therein and is connected to the connection point of said first diode and said switching element;
   a first means supplying said read pulse to the control electrode of said switching element; and
   a second means supplying a bias voltage which includes a blooming suppression pulse to one of said first and second diodes, the blooming suppression pulse being in synchronism with the read pulse.

6. A solid state imaging apparatus as claimed in claim 5, wherein said first diode comprises a heterojunction photoconductor.

7. A solid state imaging apparatus as claimed in claims 5 or 6, wherein said bias voltage has a predetermined voltage level except in the interval of said blooming suppression pulse, and the connection point of said first and second diodes is clamped at a voltage level decided by the predetermined voltage level when the intensity of the incident light exceeds a predetermined amount.

8. A solid state imaging apparatus as claimed in claim 5, wherein said cell further comprises;
   a temporary storage region for temporary storing said charge signals read out through said switching element from said first diode; and
   a transfer element having an electrode for transfering out the charge signals from said temporary storage region for producing the video signal under the control of a transfer pulse provided to the electrode which is coupled to the control electrode of said switching element.

9. A solid state imaging apparatus as claimed in claim 8, wherein the amplitude of said read pulse is larger than that of said transfer pulse.

10. A solid state imaging apparatus as claimed in claim 8, wherein the amplitude of said read pulse is equal to that of said transfer pulse.

11. A solid state imaging apparatus as claimed in claims 8, 9 or 10, wherein the level of the bias voltage is larger than that of said transfer pulse and the connection point of said first diode and said switching element is clamped at a predetermined voltage level decided by said bias voltage when the intensity of the incident light is about to exceed a predetermined amount.

12. A solid state imaging apparatus for producing a video signal representing an optical image of an object, said apparatus comprising;
- a semiconductor substrate;
- a plurality of a diffused regions which are formed in said substrate and having an opposite conductivity characteristic with respect to that of said substrate so as to form a first diode;
- a plurality of other regions which are formed in or upon said diffused regions so as to form a second diode;
- an insulating layer formed on said substrate;
- a gate electrode means which is formed on said insulating layer and which reads out charge signals which are accumulated in one of said first and second diodes and whose values are in proportion to the amount of the incident light, said gate electrode means operating under the control of a read pulse supplied thereto;
- an electrode means electrically coupled to said other regions, said electrode means being supplied with a bias voltage including a blooming suppression pulse which is applied in synchronism with said read pulse;
- a means for outputting said read pulse which is applied to said gate electrode means; and
- a means for outputting said bias voltage which is applied to said electrode means.

13. A solid state imaging apparatus as claimed in claim 12, wherein said other regions comprise heterojunction photoconductors formed upon said diffused regions for accumulating the charge signals.

14. A solid state imaging apparatus as claimed in claim 12, wherein said other regions comprise second diffused regions each of which is formed in said diffused regions and have an opposite conductivity characteristic with respect to that of said diffused regions to form the second diode.

15. A solid state imaging apparatus as claimed in claims 12, 13 or 14, wherein the potential of said diffused regions is clamped at a predetermined level decided by the level of said bias voltage when the amount of the incident light is about to exceed a predetermined amount.

16. A solid state imaging apparatus as claimed in claim 12, further comprising;
- a plurality of temporary storage regions in the substrate for temporary storing said charge signals which are read out from said diffused regions under the control of the read pulse, and
- a transfer means which includes said gate electrode means and transfers said charge signals from said storage regions under the control of a transfer pulse supplied to said gate electrode means.

17. A solid state imaging apparatus as claimed in claim 16, wherein the amplitude of said read pulse is larger than that of said transfer pulse.

18. A solid state imaging apparatus as claimed in claim 16, wherein the amplitude of said read pulse is equal to that of said transfer pulse.

19. A solid stage imaging apparatus as claimed in claims 16, 17 or 18, wherein the level of the bias voltage is larger than that of said transfer pulse and the potential of said diffused regions is clamped at a predetermined level decided by the level of said bias voltage when the amount of the incident light is about to exceed a predetermined amount.

* * * * *